United States Patent [19]

Tseng

[11] Patent Number: 5,821,151
[45] Date of Patent: Oct. 13, 1998

[54] METHOD OF MAKING A CAPACITOR VIA CHEMICAL MECHANICAL POLISH

[75] Inventor: Horng-Huei Tseng, Hsinchu, Taiwan

[73] Assignee: Vanguard International Semiconductor Corporation, Hsinchu, Taiwan

[21] Appl. No.: 861,970

[22] Filed: May 22, 1997

[51] Int. Cl.⁶ .................. H01L 21/20; H01L 21/8242
[52] U.S. Cl. .................. 438/396; 438/253; 438/947; 438/964
[58] Field of Search .................. 438/253, 396, 438/947, 964, 255, 398

[56] References Cited

U.S. PATENT DOCUMENTS

| | | | |
|---|---|---|---|
| 5,670,406 | 9/1997 | Tseng | 438/398 |
| 5,670,407 | 9/1997 | Tseng | 438/398 |
| 5,681,774 | 10/1997 | Tseng | 438/398 |

Primary Examiner—Charles L. Bowers, Jr.
Assistant Examiner—Toniae M. Thomas
Attorney, Agent, or Firm—Christensen, O'Connor, Johnson & Kindness PLLC

[57] ABSTRACT

A method of manufacturing a capacitor for use in semiconductor memories includes forming an undoped dot silicon layer on a doped polysilicon layer. Thermal oxidation is used to convert the dot silicon layer and portions of the doped polysilicon layer into silicon oxide. Then a CMP process is used to remove the oxidized dot silicon layer to create a silicon oxide etching mask. Next, an etching process is performed to form a large number of cavities in the doped polysilicon layer. The silicon oxide layer is then removed and the doped polysilicon layer is patterned and etched to form a bottom storage node of the capacitor.

21 Claims, 4 Drawing Sheets

METHOD OF MAKING A CAPACITOR VIA CHEMICAL MECHANICAL POLISH

FIELD OF THE INVENTION

The present invention relates to semiconductor capacitors, and more specifically, to a method of making a capacitor for a DRAM cell.

BACKGROUND OF THE INVENTION

The earliest Dynamic Random Access Memory (DRAMs) used three-transistor cells and were fabricated using p-channel metal-oxide semiconductor (PMOS) technology. However, DRAM cells having only one transistor and one capacitor were quickly developed, and such cells have been used in DRAMs ever since.

The information of a DRAM memory cell includes the formation of a transistor, a capacitor and contacts to external circuits. DRAM memory cells typically use a planar type of capacitor because they are relatively simple to manufacture. However, it has been a trend to increase density or integration of the integrated circuits formed in a wafer. This large integration of DRAMs has been accomplished to a large extent by a reduction in individual cell size. The reduction in cell size results in a decrease in storage capacitance leading to reliability drawbacks, such as a lower signal to noise ratio and undesirable signal problems. The desired large scale integration in DRAM devices along with reliable operation can be achieved by using DRAM storage capacitors with a high storage capacitance relative to its cell area. As the capacity of DRAMs has increased, the sizes of the memory cells have steadily decreased. For very small memory cells, planar capacitors become very difficult to use reliably. For example, as the size of the capacitor decreases, the capacitance of the capacitor also decreases and the amount of the charge capable of being stored by the capacitor similarly decreases. Additionally, as the capacitance decreases, the charge held by the storage capacitor must be refreshed more often.

Prior art approaches to overcoming these problems have resulted in the development of a capacitor with a HemiSpherical grain (HGS-Si) polysilicon storage node. A Capacitor-Over-Bit-Lane Cell with a HemiSpherical Grain Storage Node for 64 Mb Drams, IEDM 1990, PP. 655–58). The HSG-Si storage node can be fabricated by addition of two process steps, i.e., HSG-Si deposition and an etchback. The HSG-Si is deposited by low pressure chemical vapor deposition method under the deposition conditions as for conventional poly-si, except for the deposition temperature. Deposition is carried out with the He-diluted $SiH_4$ gas at 1.0 torr pressure at a temperature of 550° C.

Yet another HSG-Si electrode node has been proposed (see New Cylindrical Capacitor Using HemiSpherical Grained Si (HSG-Si) For 256 Mb Drams, IEDM 1992, pp. 259–62). The HSG-Si is formed by using seeding method in which the HSG-Si is formed by using chemical vapor deposition (CVD) at the transition temperature from amorphous silicon to polycrystalline silicon.

SUMMARY OF THE INVENTION

In accordance with the present invention, a method to fabricate a capacitor with an enlarged surface area is provided. In one embodiment, a dielectric layer is formed over a substrate. A contact hole is subsequently formed in the first dielectric layer. A first conductive layer is formed on the first dielectric layer, filling the contact hole. Subsequently, an undoped dot silicon layer is formed on the first conductive layer. Preferably, the undoped dot silicon layer is formed of HemiSpherical Grained silicon (HSG-Si), with the diameter of the HSG-Si dots being about 50–500 angstroms. The spacing between the HSG-Si dots is preferably about 100–1000 angstroms.

Next, a thermal oxidation is performed in an oxygen ambient. Thus, the HSG-Si is converted into silicon oxide. In addition, portions of the first conductive layer that are uncovered by the HSG-Si dots are converted into polysilicon oxide. Next, chemical mechanical polishing (CMP) is performed to remove the dot silicon oxide layer and an upper portion of the polysilicon oxide layer, down to the surface of the polysilicon layer. As a result, residual polysilicon oxide is left in the first polysilicon layer.

Then, a high selectivity etching process is performed using the residual polysilicon oxide as an etching mask to etch the first polysilicon layer. Therefore, a large number of cavities are formed in the first conductive layer. These cavities advantageously increase the surface area of the first conductive layer. The polysilicon oxide is then removed. Then the first conductive layer is patterned and etched to form a bottom storage node of the capacitor. A second dielectric layer is then deposited along the surface of the first conductive layer. Finally, a second conductive layer is deposited over the second dielectric layer. Thus, the capacitor with an enlarged surface is formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the capacitor described herein includes many process steps that are well known in the art. For example, etching processes that are highly selective between polysilicon and oxide, and chemical mechanical polishing (CMP) processes are well known in the art and are used herein without a detailed discussion of these well known technologies.

Figure 1:
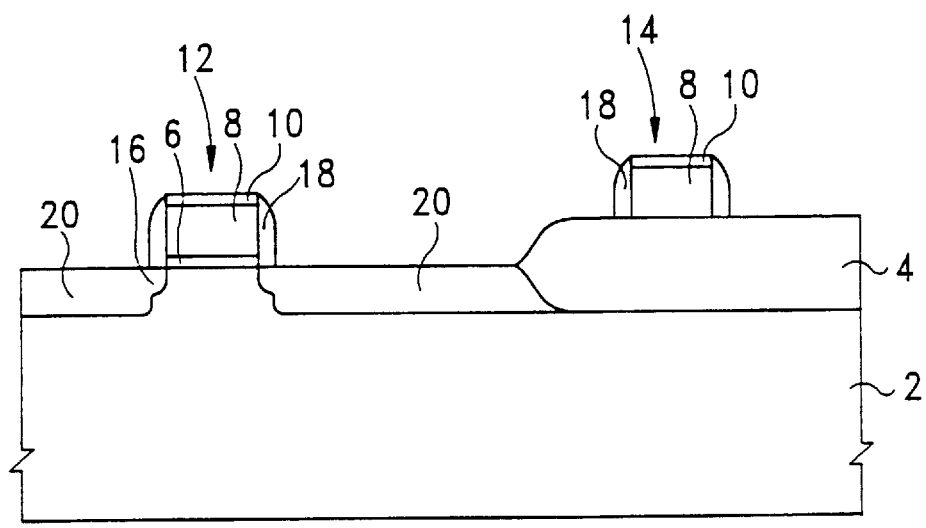
FIG. 1 is a cross-sectional view of a semiconductor wafer illustrating the steps of forming a gate structure on a semiconductor substrate.

Referring to FIG. 1, a P or N-type single crystal silicon substrate 2 with a <100> crystallographic orientation is provided. Then an isolation region 4 is formed using a suitable technique such as thick field oxide (FOX) or trench isolation technology. In the present invention, a FOX region 4 is formed to provide isolation between devices on the substrate 2. The FOX region 4 is created in a conventional manner.

Next, a silicon dioxide layer 6 is created on the top surface of the substrate 2 to serve as the gate oxide for subsequently formed Metal Oxide Silicon Field Effect Transistors (MOSFETs). In one embodiment, the silicon dioxide layer 6 is formed by thermal oxidation in an oxygen ambient, at a temperature of about 800° to 1100° C. Alternatively, the oxide layer 6 may be formed using any suitable oxide chemical compositions and procedures. In the preferred embodiment, the thickness of the silicon dioxide layer 6 is approximately 30–200 angstroms.

A doped first polysilicon layer 8 is then formed over the FOX region 4 and the silicon dioxide layer 6 using a Low Pressure Chemical Vapor Deposition (LPCVD) process. In this embodiment, the first polysilicon layer 8 has a thickness of about 1000–3000 angstroms. A capped oxide layer 10 is formed on the first polysilicon layer 8. Next, standard photolithography and etching steps are used to form a gate structure 12 and a word line 14. Then lightly doped drain (LDD) region 16 is formed by light ion implantation. Sidewall spacers 18 are generated by using well known technology. Subsequently, active regions 20 (i.e., the source and the drain) are formed by using well known processes to implant appropriate impurities in those regions.

Figure 2:
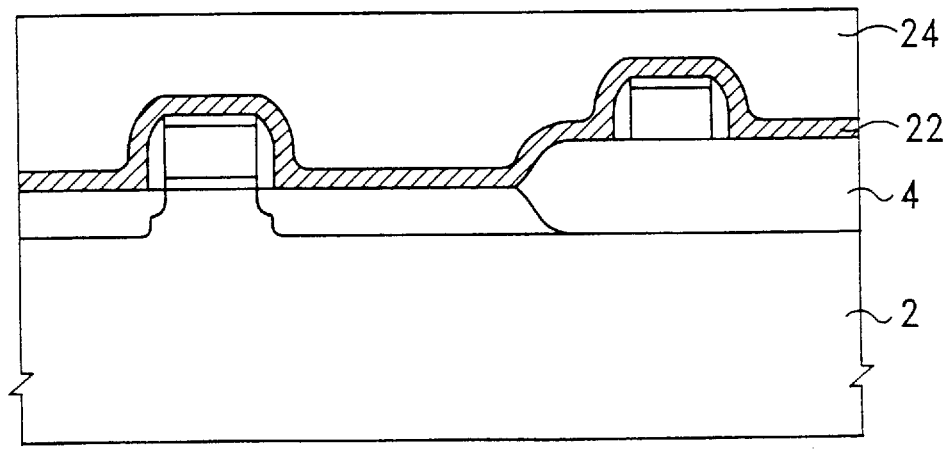
FIG. 2 is a cross-sectional view of the semiconductor wafer illustrating the steps of forming an oxide layer and a first dielectric layer on the semiconductor substrate.

Turning next to FIG. 2, an undoped oxide layer 22 is formed by CVD on the gate structure 12, the word line 14 and the substrate 2 for isolation. The thickness of the oxide layer 22 is about 1000 to 2000 angstroms. In other embodiments, the oxide layer 22 may be omitted. Next, the first dielectric layer 24 is formed on the undoped oxide layer 22 for serving as an insulator. The first dielectric layer 24 can be formed by using suitable material such as borophosphosilicate glass (BPSG) or TEOS-oxide etc. The thickness of the first dielectric layer 24 is about 3000 to 6000 angstroms. In this embodiment, the first dielectric layer is a doped oxide that is planarized using a CMP process.

Figure 3:
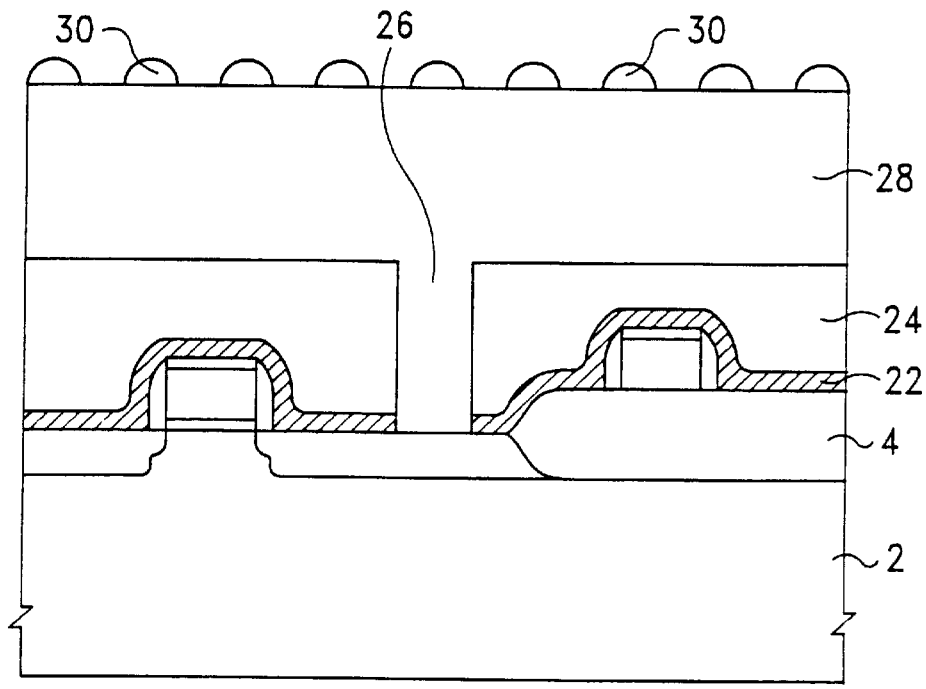
FIG. 3 is a cross-sectional view of the semiconductor wafer illustrating the steps of forming a contact hole in the first dielectric layer and the oxide layer; forming a first conductive layer on the first dielectric layer and in the contact hole; and forming an HSG-Si layer on the first conductive layer.

Referring to FIG. 3, a contact hole 26 is subsequently formed in the first dielectric layer 24 and the oxide layer 22 to one of the active regions 20 by using well known photolithography and etching processes. A first conductive layer 28 is formed and on the first dielectric layer 24, filling the contact hole 26. The first conductive layer 28 is formed using conventional LPCVD processing. The thickness of the first conductive layer 28, as measured over the first dielectric layer 24, is optimally 1000 to 8000 angstroms. The first conductive layer 28 is doped polysilicon, preferably insitu doped polysilicon. The dopant concentration of the first conductive layer is about $1E20$–$1E21$ atoms/cm$^3$. Subsequently, an undoped dot silicon layer 30 is formed on the first conductive layer 28. The term "dot silicon layer" is used herein to refer to a layer of closely spaced silicon particles or dots. These dots preferably have a relatively small nominal diameter. In this embodiment, the undoped dot silicon layer 30 is formed of HemiSpherical Grained silicon (HSG-Si). The undoped dot silicon layer 30 can be formed using an initial phase HSG-Si process or other suitable process. This initial-phase process forms HSG-Si dots randomly distributed on the first conductive layer 28. In this embodiment, the diameter of the dots is about 50–500 angstroms. In addition, the space between the dots is about 100–1000 angstroms. In other embodiments, the undoped dot silicon layer 30 may be formed by deposition of HSG polysilicon and etchback.

Figure 4:
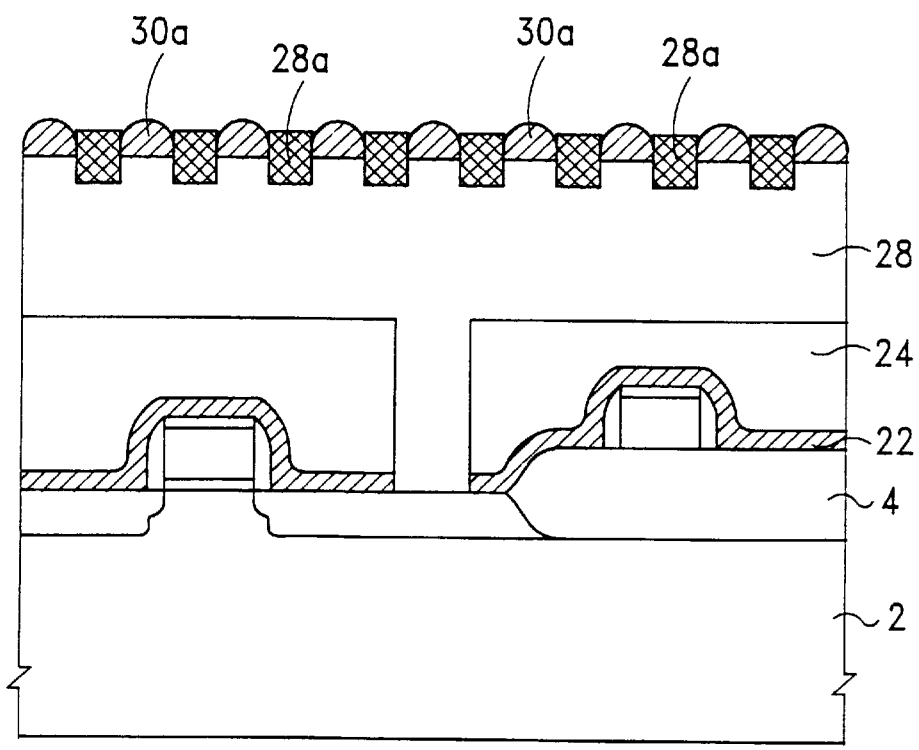
FIG. 4 is a cross-sectional view of the semiconductor wafer illustrating the step of performing a thermal oxidation to convert the HSG-Si layer and the first conductive layer into a dot silicon oxide layer and polysilicon oxide layer, respectively.

Next, as shown in FIG. 4, a thermal oxidation is carried out in oxygen ambient. The temperature of the oxidation is about 700° to 900° C. The HSG-Si layer 30 is converted into silicon oxide layer 30a. Simultaneously, portions of the first conductive layer 28 that are uncovered by the HSG-Si layer 30 are also converted into polysilicon oxide regions 28a. Typically, the thermal oxidation growth rate of the doped silicon layer 28 is faster than the growth rate of the undoped silicon layer 30. Thus, the polysilicon oxide regions 28a are thicker than the dot silicon oxide layer 30a. Further, the depth of polysilicon oxide regions 28a in the first conductive layer 28 is deeper than the depth of the dot silicon oxide layer 30a, due to the different growing rate. In one embodiment, the polysilicon oxide regions 28a are about 400 to 1600 angstroms deep.

Figure 5:
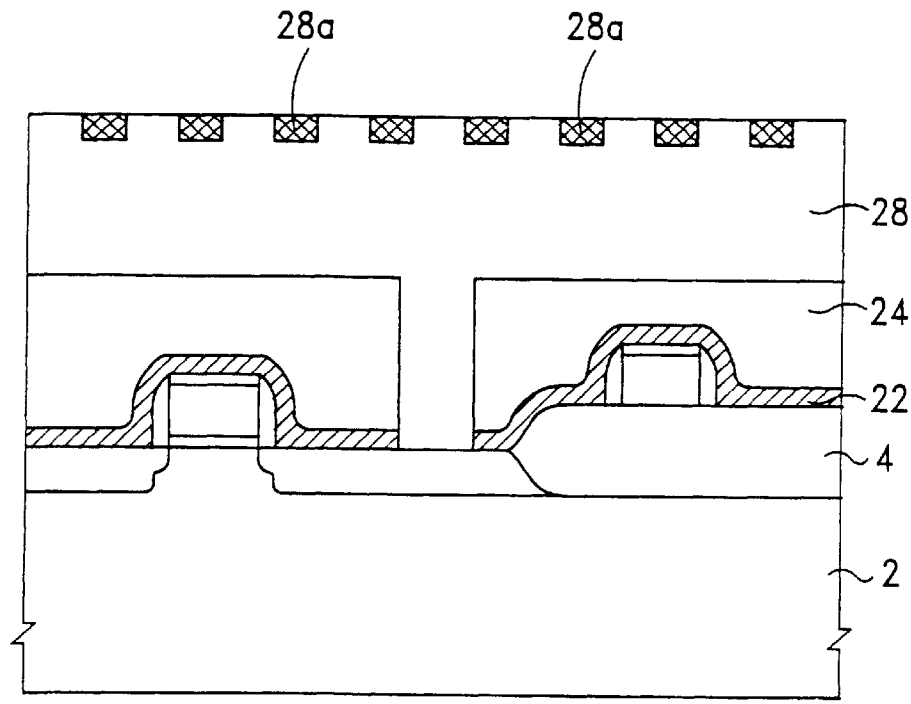
FIG. 5 is a cross-sectional view of the semiconductor wafer illustrating the step of performing a CMP process to remove the dot silicon oxide layer and a portion of the polysilicon oxide layer, down to the surface of the first conductive layer.

Next, as seen in FIG. 5, CMP is performed to remove the dot silicon oxide layer 30a (FIG. 4) and the portions of the polysilicon oxide regions 28a to the surface of the polysilicon layer 28. The dot silicon oxide layer 30a is completely removed during the CMP process. Residual polysilicon oxide regions 28a are left in the first polysilicon layer 28, with top surfaces substantially level with the top surface of the first polysilicon layer 28. As a result, portions of the polysilicon layer 28 between residual polysilicon oxide regions 28a are exposed. The residual polysilicon oxide regions 28a have dimensions and spacing smaller than the minimum feature size of typical photolithography processes.

Figure 6:
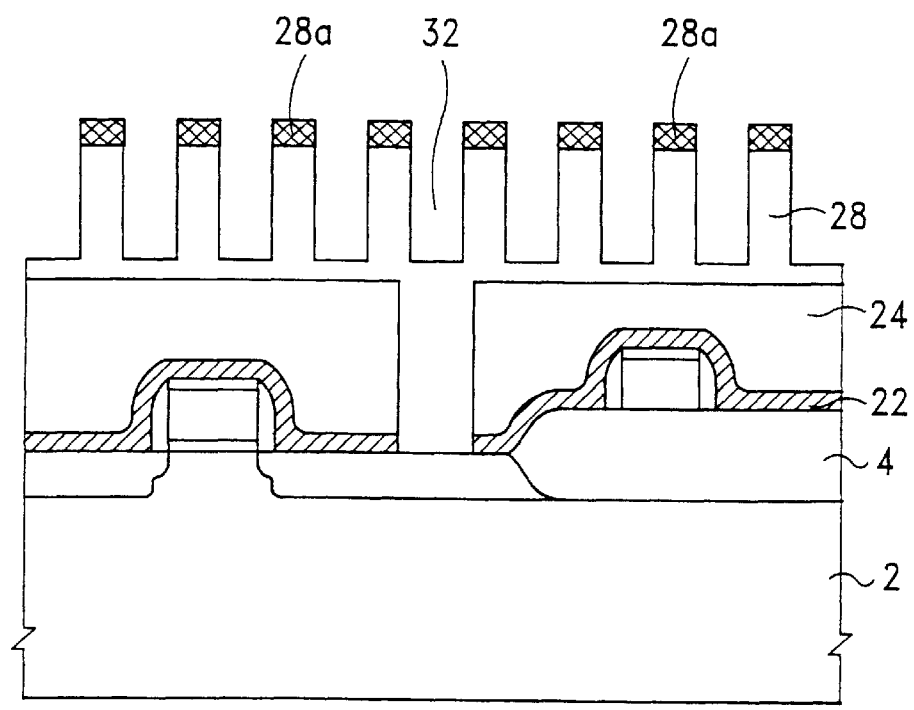
FIG. 6 is a cross-sectional view of the semiconductor wafer illustrating the step of etching the first conductive layer using the polysilicon oxide as an etching mask.

Turning to FIG. 6, reactive ion etching (RIE) processing is used to etch the first polysilicon layer 28 by using the residual polysilicon oxide layer 28a as an etching mask. The present invention uses the high etching selectivity between polysilicon oxide and polysilicon to create cavities 32 in the first polysilicon layer 28. Any suitable etchant can be used for this etching, such as $SF_6$, $CF_4+O_2$, $CF_4+Cl_2$, $CF_4+HBr$, $HBr/Cl_2 /O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$. By using one of the above etchants, the first polysilicon layer 28 is selectively etched relative to the residual polysilicon oxide regions 28a. By using a high selectivity etching process, the residual polysilicon oxide regions 28a can be relatively thin, with a thickness as little as 100 angstroms. Thus, a little over-polishing during the CMP removal of the dot silicon oxide layer 30a (FIG. 4) can be tolerated.

Figure 7:
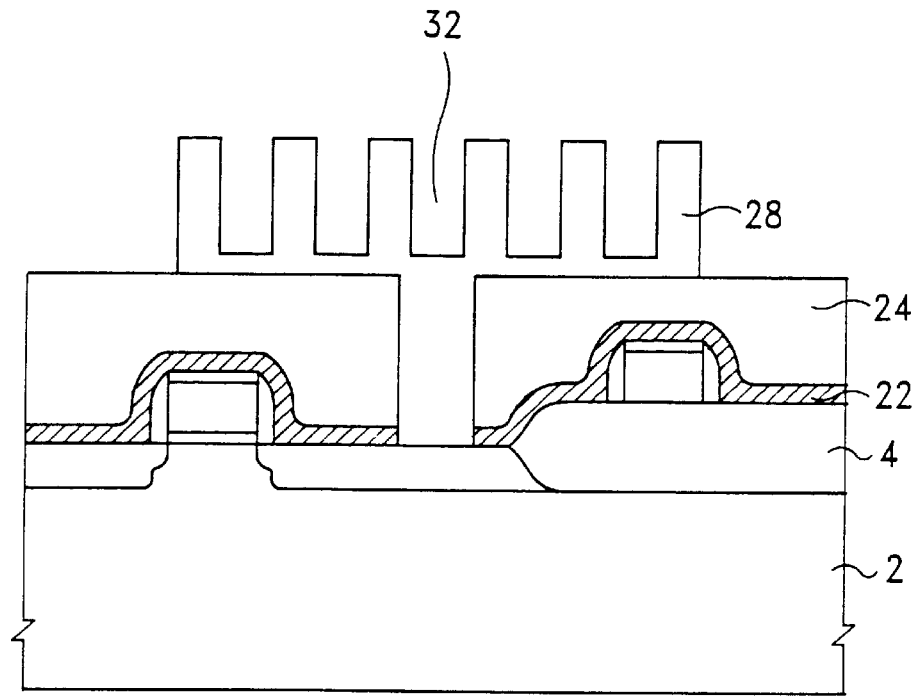
FIG. 7 is a cross-sectional view of the semiconductor wafer illustrating the step of forming a bottom storage node of a capacitor.

Referring to FIG. 7, the polysilicon oxide regions 28a are removed by using a wet etching process. In this embodiment, a buffered HF solution is used, although in other embodiments buffered oxide etching (BOE), vapor HF or diluted HF solution can be used as an etchant. Then a photoresist (not shown) is patterned on the first conductive layer 28 to define a bottom storage node. A standard polysilicon etching process is subsequently performed to etch the first polysilicon layer 28 using the photoresist as a mask. The photoresist is then removed. The resulting polysilicon structure is used as the bottom storage node of a capacitor.

Figure 8:
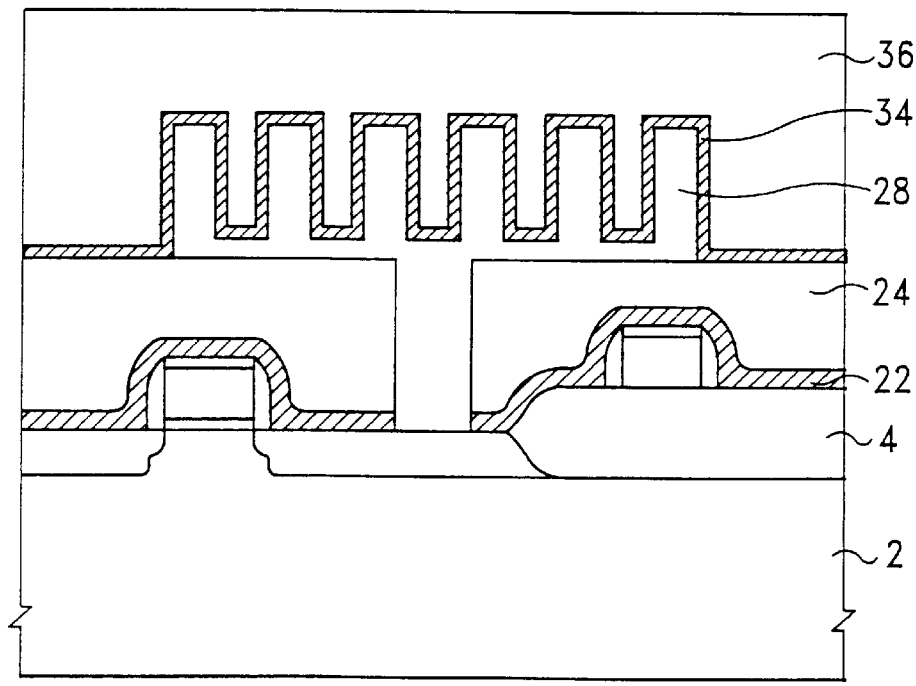
FIG. 8 is a cross-sectional view of the semiconductor wafer illustrating the steps of forming a second dielectric layer along the surface of the first conductive layer, and forming a second conductive layer on the second dielectric layer.

Turning now to FIG. 8, a second dielectric layer 34 is deposited along the surface of the first conductive layer 28. The second dielectric layer 34 is preferably formed of either a double-film of nitride/oxide film, a triple-film of oxide/nitride/oxide, or any other high dielectric film such as tantalum oxide ($Ta_2O_5$), BST. Finally, a second conductive layer 36 is deposited using a conventional LPCVD process over the second dielectric layer 34. The second conductive layer 36 serves as a top storage node and is formed of doped polysilicon. The top storage node can be formed of in-situ doped polysilicon, aluminum, copper, tungsten or titanium or other suitable conductive material.

The present invention thus provides capacitors with an enlarged surface area without enlarging the area the capacitor occupied over the substrate. Thus, high density and reliability are achieved. Further, the polysilicon oxide regions 28a that act as an etching mask to etch a portion of the polysilicon layer 28 is relatively simple to form. Therefore, the present invention increases the performance of the capacitor without significantly increasing the complexity of the fabrication process.

As will be understood by persons skilled in the art, the foregoing embodiments of the present invention, including the preferred embodiment, are illustrative of the present invention rather than limiting the present invention. For example, the method of the present invention can also be used in a COB (capacitor over bit line) structure. Also, suitable etching and deposition processes different from those described may be used in other embodiments of the invention. Thus, the invention is not to be limited to these described embodiments, but rather the invention is intended to cover various modifications and similar arrangements included within the spirit and scope of the appended claims, the scope of which should be accorded the broadest interpretation so as to encompass all such modifications and similar structures.

The embodiments of the invention in which an exclusive property or privilege is claimed are defined as follows:

1. A method for manufacturing a capacitor on a semiconductor substrate, said method comprising forming a doped polysilicon layer over said substrate;

forming an undoped dot silicon layer on said doped polysilicon layer;

oxidizing said first polysilicon layer and said dot silicon layer to form polysilicon oxide regions in said doped polysilicon layer and a dot silicon oxide layer on said doped polysilicon layer;

removing said dot silicon oxide layer and portions of said polysilicon oxide regions by chemical mechanical polishing, wherein portions of said doped polysilicon layer are exposed;

etching exposed portions of said polysilicon layer using said polysilicon oxide regions as an etching mask wherein a plurality of cavities are formed in said polysilicon layer;

removing said polysilicon oxide regions;

patterning a photoresist on said doped polysilicon layer;

etching said doped polysilicon layer to form a first storage node of said capacitor;

stripping said photoresist;

forming a dielectric layer on the surface of said first storage node of said capacitor; and forming a conductive layer over said dielectric layer to act as a second storage node of said capacitor.

2. The method of claim 1, wherein said doped polysilicon layer comprises in-situ doped polysilicon.

3. The method of claim 2, wherein said doped polysilicon layer has a thickness in a range of about 1000 to 8000 angstroms.

4. The method of claim 3, wherein said doped polysilicon layer has a dopant concentration of about 1E20–1E21 atoms/$cm^3$.

5. The method of claim 1, wherein said dot silicon layer is a HSG-Si layer.

6. The method of claim 5, wherein silicon dots of said dot silicon layer have diameters of about 50–500 angstroms.

7. The method of claim 5, wherein silicon dots of said dot silicon layer have a spacing of about 100–1000 angstroms between adjacent silicon dots.

8. The method of claim 1, wherein said first polysilicon layer is oxidized by thermal oxidation in an oxygen ambient.

9. The method of claim 8, wherein said thermal oxidation is performed at a temperature of about 700° to 900° C.

10. The method of claim 1, wherein said dielectric layer comprises tantalum oxide ($Ta_2O_5$).

11. The method of claim 1, wherein said dielectric layer comprises a triple film of oxide/nitride/oxide.

12. The method of claim 1, wherein said dielectric layer comprises a double film of nitride/oxide film.

13. The method of claim 1, wherein said conductive layer comprises in-situ doped polysilicon.

14. A method of forming a silicon structure on a semiconductor substrate, said method comprising:

forming a doped polysilicon layer over said substrate;

forming an undoped dot silicon layer on said polysilicon layer;

thermally oxidizing said first doped polysilicon layer and said dot silicon layer in an oxygen ambient to form a plurality of polysilicon oxide regions in said first polysilicon layer between silicon dots of said dot silicon layer and a dot silicon oxide layer on said doped polysilicon layer;

removing said dot silicon oxide layer and upper portions of said polysilicon oxide regions by chemical mechanical polishing wherein portions of said doped polysilicon layer are exposed;

etching exposed portions of said doped polysilicon layer using said plurality of polysilicon oxide regions as an etching mask; and removing said polysilicon oxide layer.

15. The method of claim 14, wherein said doped polysilicon layer comprises in-situ doped polysilicon.

16. The method of claim 15, wherein said doped polysilicon layer has a thickness in a range of about 1000–8000 angstroms.

17. The method of claim 16, wherein said doped polysilicon layer has a dopant concentration of about 1E20–1E21 atoms/$cm^3$.

18. The method of claim 14, wherein said dot silicon layer is an HSG-Si layer.

19. The method of claim 18,, wherein said HSG-Si layer is formed using an initial-phase HSG-Si process.

20. The method of claim 18, wherein said HSG-Si has a grain size of about 50–500 angstroms.

21. The method of claim 18, wherein said HSG-Si has a grain spacing of about 100–1000 angstroms.

* * * * *